(12) United States Patent
Alhussien et al.

(10) Patent No.: US 9,236,099 B2
(45) Date of Patent: Jan. 12, 2016

(54) MULTIPLE RETRY READS IN A READ CHANNEL OF A MEMORY

(71) Applicant: Seagate Technology LLC, Cupertino, CA (US)

(72) Inventors: AbdelHakim S. Alhussien, San Jose, CA (US); Yunxiang Wu, Cupertino, CA (US); Sundararajan Sankaranarayanan, Fremont, CA (US); Zhengang Chen, San Jose, CA (US); Erich F. Haratsch, Bethlehem, PA (US)

(73) Assignee: Seagate Technology LLC, Cupertino, CA (US)

( * ) Notice: Subject to any disclaimer, the term of this patent is extended or adjusted under 35 U.S.C. 154(b) by 95 days.

(21) Appl. No.: 14/136,283

(22) Filed: Dec. 20, 2013

(65) Prior Publication Data

US 2015/0162057 A1  Jun. 11, 2015

Related U.S. Application Data

(60) Provisional application No. 61/914,056, filed on Dec. 10, 2013.

(51) Int. Cl.

| | |
|---|---|
| *G11C 7/00* | (2006.01) |
| *G11C 7/12* | (2006.01) |
| *G11C 13/00* | (2006.01) |
| *G11C 16/26* | (2006.01) |
| *G11C 7/14* | (2006.01) |
| *G11C 11/56* | (2006.01) |
| *G11C 16/28* | (2006.01) |

(52) U.S. Cl.
CPC .. *G11C 7/12* (2013.01); *G11C 7/14* (2013.01); *G11C 11/5642* (2013.01); *G11C 13/004* (2013.01); *G11C 16/26* (2013.01); *G11C 16/28* (2013.01)

(58) Field of Classification Search
CPC ........ G11C 16/26; G11C 7/14; G11C 13/004; G11C 16/3422; G11C 11/1673; G11C 8/10; G11C 2211/5646; G11C 2013/0057; G11C 5/147
USPC ............... 365/189.11, 185.02, 185.2, 185.22, 365/189.011, 189.15, 189.09
See application file for complete search history.

(56) References Cited

U.S. PATENT DOCUMENTS

| | | | |
|---|---|---|---|
| 8,406,048 B2 | 3/2013 | Yang et al. | 365/185.02 |
| 8,498,152 B2 | 7/2013 | Alrod et al. | 365/185.03 |
| 8,531,888 B2 | 9/2013 | Chilappagari et al. | 365/185.2 |
| 8,576,625 B1 | 11/2013 | Yang et al. | 365/185.09 |
| 2012/0236638 A1 | 9/2012 | Weingarten et al. | 365/185.2 |
| 2012/0317460 A1* | 12/2012 | Chilappagari et al. | 714/773 |
| 2013/0229867 A1 | 9/2013 | Tang et al. | 365/185.2 |
| 2015/0052387 A1* | 2/2015 | Kern et al. | 714/6.13 |

* cited by examiner

*Primary Examiner* — Fernando Hidalgo
(74) *Attorney, Agent, or Firm* — Christopher P. Maiorana, PC

(57) ABSTRACT

An apparatus having a circuit and a decoder is disclosed. The circuit is configured to (i) adjust an initial one of a plurality of reference voltages in a read channel of a memory by shifting the initial reference voltage an amount toward a center of a window and (ii) read a codeword from the memory a number of times. The window bounds a sweep of the reference voltages. Each retry of the reads uses a respective reference voltage from a pattern of the reference voltages. The pattern is symmetrically spaced about the initial reference voltage. The pattern fits in the window. The decoder is configured to generate read data by performing an iterative decoding procedure on the codeword based on the reads.

20 Claims, 21 Drawing Sheets

TABLE 1

| | READ | LLR 0 | LLR 1 | LLR 2 | LLR 3 | LLR 4 | LLR 5 | LLR 6 | LLR 7 | LLR 8 | LLR 9 | LLR 10 | LLR 11 | LLR 12 | LLR 13 |
|---|---|---|---|---|---|---|---|---|---|---|---|---|---|---|---|
| LSB | 1 | 6 | -5 | | | | | | | | | | | | |
| | 2 | 5 | -3 | -6 | | | | | | | | | | | |
| | 3 | 5 | 3 | -3 | -6 | | | | | | | | | | |
| | 4 | 5 | 3 | -3 | -4 | -6 | | | | | | | | | |
| | 5 | 5 | 4 | 3 | -3 | -4 | -6 | | | | | | | | |
| | 6 | 5 | 4 | 3 | -1 | -2 | -4 | -6 | | | | | | | |
| | 7 | 5 | 4 | 2 | 1 | -1 | -2 | -4 | -6 | | | | | | |
| MSB | 1 | 6 | -5 | | | | | | | | | | | | |
| | 2 | 5 | 3 | -6 | -3 | | | | | | | | | | |
| | 3 | 5 | 3 | -3 | -6 | -3 | 3 | -3 | 3 | | | | | | |
| | 4 | 5 | 4 | 3 | -3 | -6 | -4 | -3 | 3 | 3 | | | | | |
| | 5 | 5 | 4 | 3 | -3 | -4 | -6 | -4 | -3 | -2 | 4 | | | | |
| | 6 | 5 | 4 | 2 | 1 | -3 | -4 | -6 | -4 | -2 | -1 | 3 | 4 | | |
| | 7 | 5 | 4 | 2 | 1 | -1 | -2 | -4 | -6 | -4 | -2 | -1 | 1 | 2 | 4 |

FIG. 9

$3\Delta > \delta = 0.25 \geq 2\Delta$     $\Delta > \delta = 0.08$

| 4 | -4 |    |    |    |    |    |    |
|---|----|----|----|----|----|----|----|
| 4 | -3 | -4 |    |    |    |    |    |
| 5 | 0  | -3 | -5 |    |    |    |    |
| 5 | 0  | -3 | -4 | -5 |    |    |    |
| 5 | 3  | 0  | -3 | -4 | -5 |    |    |
| 5 | 3  | 0  | -1 | -2 | -4 | -5 |    |
| 6 | 2  | 1  | -1 | -2 | -4 | -5 | -6 |

| 4 | -4 |    |    |    |    |    |    |
|---|----|----|----|----|----|----|----|
| 4 | 3  | -4 |    |    |    |    |    |
| 5 | 4  | 3  | -5 |    |    |    |    |
| 5 | 4  | 3  | 1  | -5 |    |    |    |
| 5 | 5  | 4  | 3  | 1  | -5 |    |    |
| 5 | 5  | 4  | 3  | 2  | 1  | -5 |    |
| 6 | 5  | 5  | 4  | 3  | 2  | 1  | -6 |

FIG. 15

$2\Delta > \delta = 0.14 \geq \Delta$

| 4 | -4 |    |    |    |    |    |
|---|----|----|----|----|----|----|
| 4 | -3 | -4 |    |    |    |    |
| 5 | -2 | -4 | -5 |    |    |    |
| 5 | -2 | -3 | -4 | -5 |    |    |
| 5 | 1  | -2 | -3 | -4 | -5 |    |
| 5 | 1  | -2 | -3 | -4 | -5 | -5 |
| 6 | 1  | -1 | -2 | -3 | -4 | -5 | -6 |

$2\Delta > \delta = 0.1 \geq \Delta$

| 4 | -4 |    |    |    |    |    |
|---|----|----|----|----|----|----|
| 4 | 3  | -4 |    |    |    |    |
| 5 | 4  | 3  | -5 |    |    |    |
| 5 | 4  | 3  | -1 | -5 |    |    |
| 5 | 4  | 3  | 2  | -1 | -5 |    |
| 5 | 4  | 3  | 2  | 1  | -1 | -5 |
| 6 | 5  | 4  | 3  | 2  | 1  | -1 | -6 |

FIG. 18

$2\Delta > \delta = 0.14 \geq \Delta$

| 4 | -4 |    |    |    |    |    |    |
|---|----|----|----|----|----|----|----|
| 4 | -3 | -4 |    |    |    |    |    |
| 5 | -2 | -4 | -5 |    |    |    |    |
| 5 | -2 | -3 | -4 | -5 |    |    |    |
| 5 | 1  | -2 | -3 | -4 | -5 |    |    |
| 5 | 1  | -2 | -3 | -4 | -5 | -5 |    |
| 6 | 1  | -1 | -2 | -3 | -4 | -5 | -6 |

$\delta = 0.31 \geq 3\Delta$

| 4 | -4 |    |    |    |    |    |    |
|---|----|----|----|----|----|----|----|
| 4 | 0  | -4 |    |    |    |    |    |
| 5 | 3  | 0  | -5 |    |    |    |    |
| 5 | 3  | 0  | -2 | -5 |    |    |    |
| 5 | 4  | 3  | 0  | -2 | -5 |    |    |
| 5 | 4  | 3  | 1  | -1 | -2 | -5 |    |
| 6 | 5  | 4  | 2  | 1  | -1 | -2 | -6 |

FIG. 21

$2\Delta > \delta = 0.14 \geq \Delta$

| 4 | -4 |    |    |    |    |    |
|---|----|----|----|----|----|----|
| 4 | -3 | -4 |    |    |    |    |
| 5 | -2 | -4 | -5 |    |    |    |
| 5 | -2 | -3 | -4 | -5 |    |    |
| 5 | 1  | -2 | -3 | -4 | -5 |    |
| 5 | 1  | -2 | -3 | -4 | -5 | -5 |
| 6 | 1  | -1 | -2 | -3 | -4 | -5 | -6 |

$\delta = 0.31 \geq 3\Delta$

| 4 | -4 |    |    |    |    |    |
|---|----|----|----|----|----|----|
| 4 | -3 | -4 |    |    |    |    |
| 5 | 0  | -3 | -5 |    |    |    |
| 5 | 0  | -3 | -4 | -5 |    |    |
| 5 | 3  | 0  | -3 | -4 | -5 |    |
| 5 | 3  | 0  | -1 | -2 | -4 | -5 |
| 6 | 2  | 1  | -1 | -2 | -4 | -5 | -6 |

MULTIPLE RETRY READS IN A READ CHANNEL OF A MEMORY

This application relates to U.S. Provisional Application No. 61/914,056, filed Dec. 10, 2013 which is hereby incorporated by reference in its entirety.

FIELD OF THE INVENTION

The invention relates to soft decoding generally and, more particularly, to a method and/or apparatus for implementing multiple retry reads in a read channel of a memory.

BACKGROUND

A range in which read reference voltages in multi-level cell flash memory can be set is referred to as a voltage sweep window. Due to implementation limitations and other considerations by the flash memory manufactures, the range is often limited by a narrow voltage sweep window around a default value. Even if the voltage sweep window is wide enough, considerable degradation of flash cell quality, voltage drift by retention effects and read disturb can move a preferred read voltage setting outside the voltage sweep window. For other situations, the various factors make the preferred read voltage too close to the edges of the voltage sweep window or too close to unreliable regions of the possible range. As a result, an ability to use more read voltages around the preferred read voltage in read retries is effected.

SUMMARY

The invention concerns an apparatus having a circuit and a decoder. The circuit is configured to (i) adjust an initial one of a plurality of reference voltages in a read channel of a memory by shifting the initial reference voltage an amount toward a center of a window and (ii) read a codeword from the memory a number of times. The window bounds a sweep of the reference voltages. Each retry of the reads uses a respective reference voltage from a pattern of the reference voltages. The pattern is symmetrically spaced about the initial reference voltage. The pattern fits in the window. The decoder is configured to generate read data by performing an iterative decoding procedure on the codeword based on the reads.

BRIEF DESCRIPTION OF THE FIGURES

Embodiments of the invention will be apparent from the following detailed description and the appended claims and drawings in which:

FIG. 9 is a table of default log likelihood ratio values;
FIG. 15 is a set of lower page edge tables;
FIG. 18 is another set of lower page edge tables;
FIG. 21 is a set of lower page edge tables;
FIG. 24 is another set of lower page edge tables.

DETAILED DESCRIPTION OF THE EMBODIMENTS

Embodiments of the invention include providing multiple retry reads in a read channel of a memory that may (i) use a fixed retry read pattern, (ii) have uniform spacing between retry read reference voltages in some embodiments, (iii) shift the pattern center to account for a median read reference voltage too close to an edge of a voltage sweep window, (iv) modify log likelihood ratio (e.g., soft) values used in soft decoding to account for the shift of the pattern center for each retry read, (v) store the log likelihood ratio values in a lookup table and/or (vi) be implemented as one or more integrated circuits.

Embodiments of the invention provide a technique to reduce an effect of limited voltage sweep windows on multiple retry reads and generation of soft information. One or more lookup tables (e.g., LUTS) are provided in a solid-state drive (e.g., SSD) controller. The lookup tables are generally populated with soft decoding parameters (e.g., log likelihood ratio (e.g., LLR) values) suitable for use in a soft decoder. The parameters in the lookup tables are predetermined in simulations or test scenarios according to design rules that aim to achieve decoding success with the least number of read retires given the constraint of the fixed read pattern. Each value corresponds to a number of reads and/or retry reads, shifted or unshifted initial median read reference voltages, a number of previously failed decoding attempts and which page is being accessed.

Although cell voltages in flash devices are continuous, flash devices only provide binary sequences (e.g., hard decisions) after each read operation. When soft decoding techniques are used for error correction, the hard decisions are converted into the decoding parameters fed into the decoder operation. The decoding parameters are associated with a single read or multiple reads. The multiple reads are performed with varying read voltages to obtain more information from the flash devices, which results in better quality of the decoding parameters.

Figure 1:
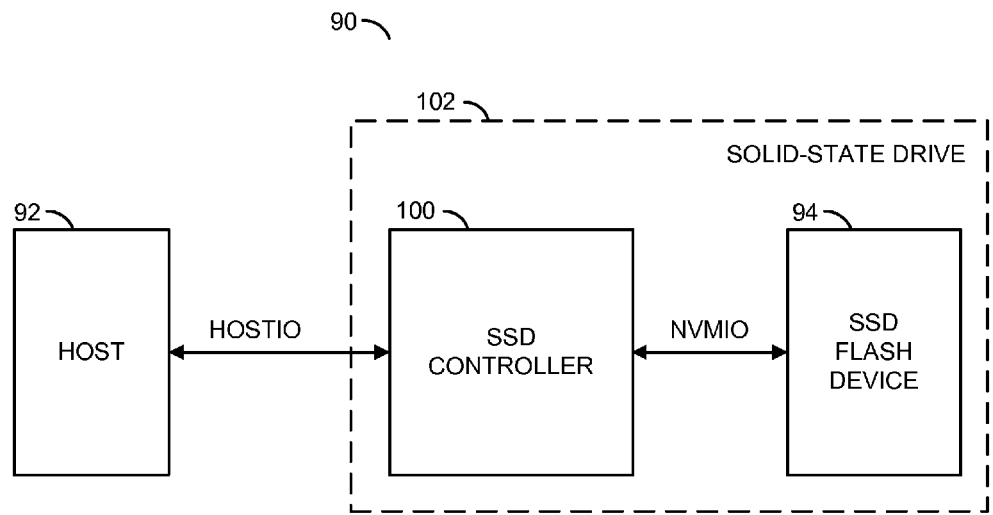
FIG. 1 is a block diagram of an apparatus.

Referring to FIG. 1, a block diagram of an example implementation of an apparatus 90 is shown. The apparatus (or circuit or device or integrated circuit) 90 implements a computer having a nonvolatile memory circuit. The apparatus 90 generally comprises a block (or circuit) 92, a block (or circuit) 94 and a block (or circuit) 100. The circuits 94 and 100 form a drive (or device) 102. The circuits 92 to 102 may represent modules and/or blocks that may be implemented as hardware, software, a combination of hardware and software, or other implementations.

One or more signals (e.g., HOSTIO) are exchanged between the circuit 92 and the circuit 100. The host input/output signal HOSTIO generally includes, but is not limited to, a logical address component used to access data in the circuit 102, a host command component that controls the circuit 102, a write data component that transfers write data from the circuit 92 to the circuit 100 and a read data component that transfers error corrected read data from the circuit 100 to the circuit 92. One or more signals (e.g., NVMIO) are exchanged between the circuit 100 and the circuit 94. The nonvolatile memory input/output signal NVMIO generally includes, but is not limited to, a physical address component used to access data in the circuit 94, a memory command component that controls the circuit 94 (e.g., read or write commands), a write codeword component that carries error correction coded and cyclical redundancy check protected write codewords written from the circuit 100 into the circuit 94 and a read codeword component that carries the error correction coded codewords read from the circuit 94 to the circuit 100.

The circuit 92 is shown implemented as a host circuit. The circuit 92 is generally operational to read and write data to and from the circuit 94 via the circuit 100. When reading or writing, the circuit 92 transfers a logical address value in the signal HOSTIO to identify which set of data is to be written or to be read from the circuit 94. The address generally spans a logical address range of the circuit 102. The logical address can address individual data units, such as SATA (e.g., serial-ATA) sectors.

The circuit 94 is shown implementing one or more nonvolatile memory circuits (or devices). According to various embodiments, the circuit 94 comprises one or more nonvolatile semiconductor devices. The circuit 94 is generally operational to store data in a nonvolatile condition. When data is read from the circuit 94, the circuit 94 accesses a set of data (e.g., multiple bits) identified by the address (e.g., a physical address) in the signal NVMIO. The address generally spans a physical address range of the circuit 94.

In some embodiments, the circuit 94 may be implemented as a single-level cell (e.g., SLC) type circuit. A single-level cell type circuit generally stores a single bit per memory cell (e.g., a logical 0 or 1). In other embodiments, the circuit 94 may be implemented as a multi-level cell type circuit. A multi-level cell type circuit is capable of storing multiple (e.g., two) bits per memory cell (e.g., logical 00, 01, 10 or 11). In still other embodiments, the circuit 94 may implement a triple-level cell type circuit. A triple-level cell circuit stores multiple (e.g., three) bits per memory cell (e.g., a logical 000, 001, 010, 011, 100, 101, 110 or 111). A four-level cell type circuit may also be implemented. The examples provided are based on two bits per cell type devices and may be applied to all other types of nonvolatile memory.

Data within the circuit 94 is generally organized in a hierarchy of units. A block is a smallest quantum of erasing. A page is a smallest quantum of writing. A codeword (or read unit or Epage or ECC-page) is a smallest quantum of reading and error correction. Each block includes an integer number of pages. Each page includes an integral number of codewords.

The circuit 100 is shown implementing a controller circuit. The circuit 100 is generally operational to control reading to and writing from the circuit 94. The circuit 100 includes an ability to decode the read codewords received from the circuit 94. The resulting decoded data is presented to the circuit 92 via the signal HOSTIO and/or re-encoded and written back into the circuit 94 via the signal NVMIO. The circuit 100 comprises one or more integrated circuits (or chips or die) implementing the controller of one or more solid-state drives, embedded storage, or other suitable control applications.

As part of the decoding, the circuit 100 looks up soft decoding parameters (e.g., the log likelihood ratio values) stored in one or more internal tables. The decoding parameters are used as part of an iterative decoding procedure that attempts to correct any errors that may be present in the codewords. The decoding parameters generally inform the decoding procedure of a reliability for each respective bit of the codewords.

The circuit 102 is shown implementing a solid-state drive. The circuit 102 is generally operational to store data generated by the circuit 92 and return the data to the circuit 92. According to various embodiments, the circuit 102 comprises one or more: nonvolatile semiconductor devices, such as NAND Flash devices, phase change memory (e.g., PCM) devices, or resistive RAM (e.g., ReRAM) devices; portions of a solid-state drive having one or more nonvolatile devices; and any other volatile or nonvolatile storage media. The circuit 102 is generally operational to store data in a nonvolatile condition.

Figure 2:
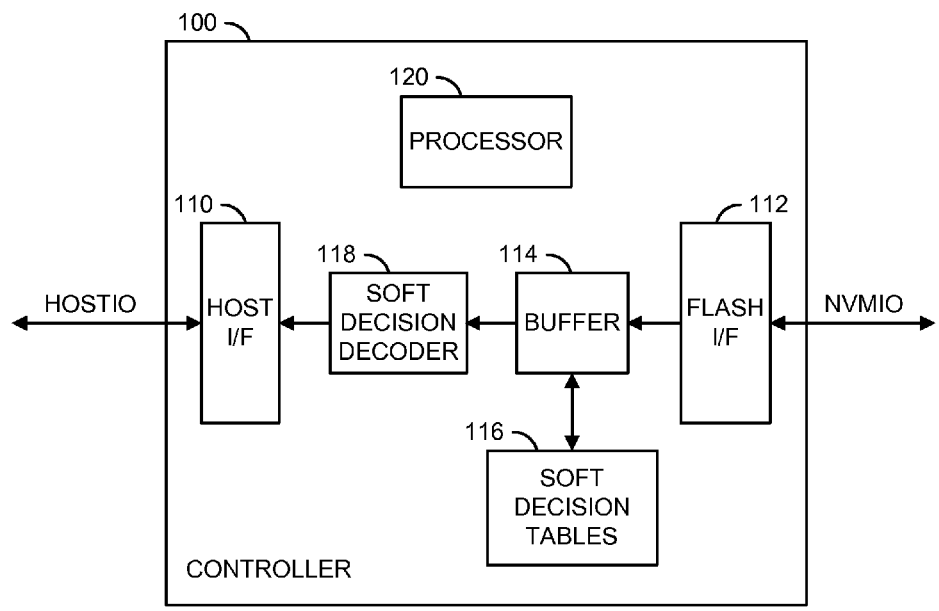
FIG. 2 is a block diagram of a controller circuit in accordance with an embodiment of the invention.

Referring to FIG. 2, a block diagram of an example implementation of the circuit 100 is shown in accordance with an embodiment of the invention. The circuit 100 generally comprises a block (or circuit) 110, a block (or circuit) 112, a block (or circuit) 114, a block (or circuit) 116, a block (or circuit) 118 and a block (or circuit) 120. The circuits 110 to 120 may represent modules and/or blocks that may be implemented as hardware, software, a combination of hardware and software, or other implementations.

The circuit 110 is shown implemented as a host interface circuit. The circuit 110 is operational to provide communication with the circuit 92 via the signal HOSTIO. Other signals may be implemented between the circuits 92 and 110 to meet the criteria of a particular application.

The circuit 112 is shown implemented as a nonvolatile memory (e.g., flash) interface circuit. The circuit 112 is operational to provide communication with the circuit 94 via the signal NVMIO. Other signals may be implemented between the circuits 94 and 110 to meet the criteria of a particular application.

The circuit 114 is shown implemented as a buffer circuit. The circuit 114 is operational to buffer codewords received from the circuit 94 via the circuit 112. The circuit 114 is also operational to buffer decoding parameters generated by the circuit 116. The read codewords and the decoding parameters are presented from the circuit 114 to the circuit 118.

The circuit 116 is shown implemented as a soft-decision table circuit. The circuit 116 is operational to store and present decoding parameters used in a soft-decision decoding performed by the circuit 118. The decoding parameters are presented by the circuit 116 to the circuit 114 for buffering and/or, in other embodiments, directly to circuit 118. A hardware or firmware unit within the circuit 116 processes the sequences of bits received from the circuit 94 into hard decision patterns. The values are generally stored within the circuit 116 as one or more lookup tables. The lookup tables are indexed into groups based on the number of reads of a current codeword. Each group has several sets of values indexed by a sequence of decoding attempts. In some embodiments, each set is indexed based on if the initial read reference voltage is shifted or not away from an edge of the voltage sweep window. The non-shifted sets contain original log likelihood ratio values. The shifted sets contain modified log likelihood ratio values. In other embodiments, each set contains the original log likelihood ratio values. The modified log likelihood ratio values are calculated when the initial read reference voltage is shifted.

The circuit 118 is shown implemented as a soft-decision decoder circuit. In some embodiments, the circuit 118 is implemented as one or more low density parity check decoder circuits. The circuit 118 is operational to perform both hard-decision (e.g., HD) decoding and soft-decision (e.g., SD) decoding of the codewords received from the circuit 114. The soft-decision decoding generally utilizes the decoding parameters presented by the circuit 116.

The circuit 120 is shown implemented as a processor circuit. The circuit 120 is operational to command and/or assist with the multiple read/write requests and to control one or more reference voltages used in the circuit 94 to read the codewords.

Figure 3:
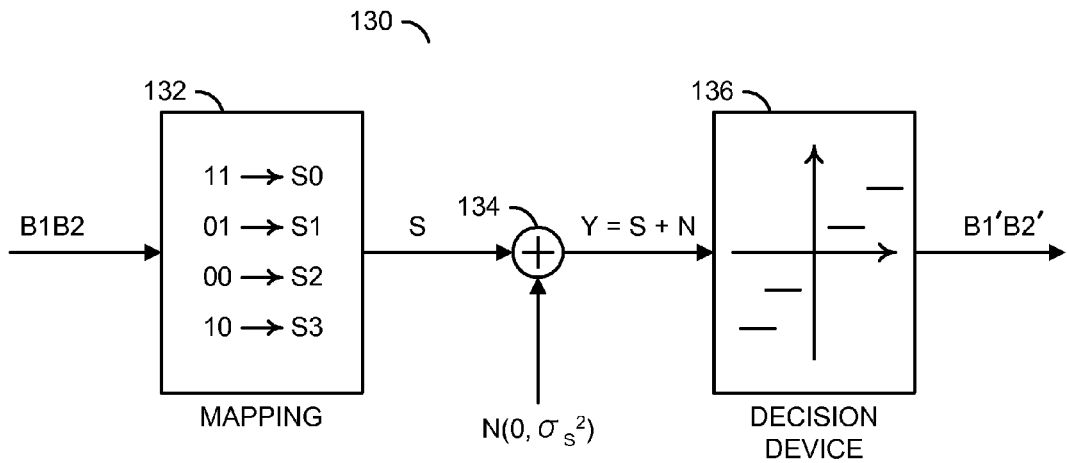
FIG. 3 is a flow diagram of an example method modeling a read channel.

Referring to FIG. 3, a flow diagram of an example method 130 modeling a read channel is shown. The method (or process) 130 generally comprises a step (or state) 132, a step (or state) 134 and a step (or state) 136. The steps 132 to 136 may represent modules and/or blocks that may be implemented as hardware, software, a combination of hardware and software, or other implementations.

From a signal processing viewpoint, the circuit 94 can be viewed as a communication channel including Gray code mapping, modulation, transmission (e.g., write operation), and detection (e.g., read operation). User data B1B2 in a multi-level cell are Gray mapped to multiple signals (e.g., S0, S1, S2, S3). A cell voltage (e.g., Y) is a noisy version of the transmitted signal. The noise is assumed to be additive white Gaussian noise (e.g., AWGN). The noise variances are different depending on the signal transmitted. User bit B1 is called a most significant bit (e.g., MSB) and is part of an upper (or most significant bit) page. User bit B2 is called a least significant bit (e.g., LSB) and is part of a lower (or least significant bit) page. Both bits B1 and B2 are mapped to the noisy cell voltage Y.

A decision device (e.g., the circuit 100) is modeled as a simple threshold detector. The thresholds result in two bits B1' and B2'. The reading process of lower pages, upper pages, and multiple retry reads can be viewed as applying different numbers of thresholds and different decision criteria.

Figure 4:
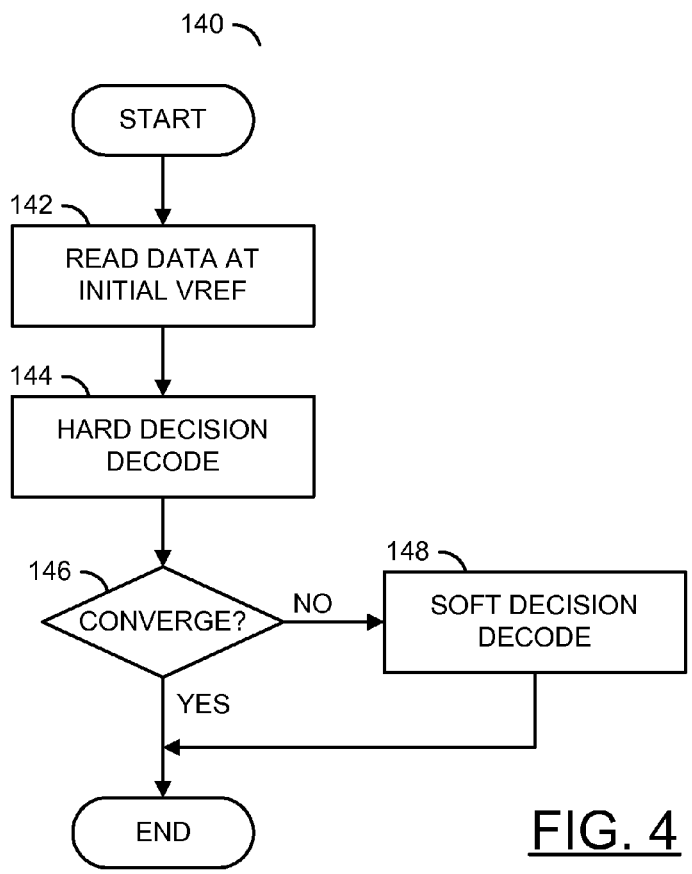
FIG. 4 is a flow diagram of a read error recovery of a codeword.

Referring to FIG. 4, a flow diagram of an example method 140 for a read error recovery of a codeword is shown. The method (or process) 140 is implemented by the circuit 100. The method 140 generally comprises a step (or state) 142, a step (or state) 144, a step (or state) 146 and a step (or state) 148. The steps 142 to 148 may represent modules and/or blocks that may be implemented as hardware, software, a combination of hardware and software, or other implementations. The sequence of the steps is shown as a representative example. Other step orders may be implemented to meet the criteria of a particular application.

In the step 142, a noisy codeword (e.g., bits B1 and B2) is read from the circuit 94 by the circuit 100 and buffered in the circuit 114. A hard-decision decoding is performed by the circuit 118 in the step 144 to decode the codeword (e.g., generate the bits B1' and B2'). If the hard-decision decoding converges per the step 146, the decoded data (e.g., bits B1' and B2') is presented in the signal HOSTIO from the circuit 110 to the circuit 92. If the hard-decision decoding does not converge per the step 146, a soft-decision decoding process is performed by at least one or more of the circuits 114, 116, 118 and 120 in the step 148. The soft-decision decoding generally utilized the log likelihood values stored in the tables in the circuit 116.

Figure 5:
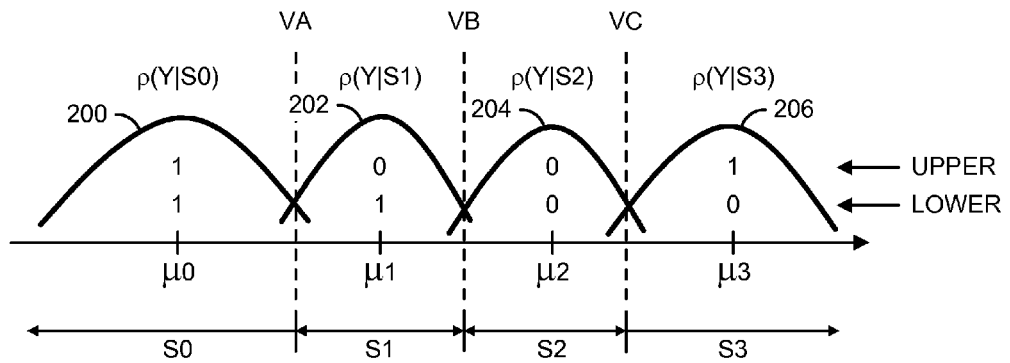
FIG. 5 is a diagram of charge-state distributions in two bits per cell type nonvolatile memory cells.

Referring to FIG. 5, a diagram of example charge-state distributions in two bits per cell type nonvolatile memory cells is shown. Each cell can be programmed into one of multiple (e.g., four) states 200-206. Each of the multiple states is interpreted as multiple (e.g., 2) bits. Half the bits are considered part of an upper page. The other half of the bits are considered part of a lower page.

The four charge-state distributions 200-206 from lower (e.g., left) to higher (e.g., right) charge are mapped to states "11", "01", "00" and "10", respectively. Each charge-state 200-206 has a respective variances (e.g., $\rho(Y|S0)$ to $\rho(Y|S3)$) and a respective mean charge (e.g., $\mu 0$ to $\mu 3$). The distributions for each charge-state 200-206 is generally different from the neighboring distribution. The distributions also vary over time and usage of the cell.

Normal reads (e.g., hard decision read) are a special case of a multi-read retry. For the lower pages, only the voltage VB (also referred to as R00) is used to determine if the cell is sensed as decisions S0/S1 or S2/S3. For the upper pages, decision criterion is different and a pair of voltages (e.g., VA, also referred to by R01, and VC, also referred to by R10) are applied. The voltage VA distinguishes between the decisions S0 and S1. The voltage VC distinguishes between the decisions S2 and S3.

In read retry, multiple hard reads are performed at different read voltages. The hard decisions of the hard reads can be converted into soft decisions based on knowledge of the channel statistics (e.g., $\rho$ and $\mu$). When higher quality of soft decisions is appropriate, more threshold voltages are applied to further refine the voltage sensed in a cell.

Figure 6:
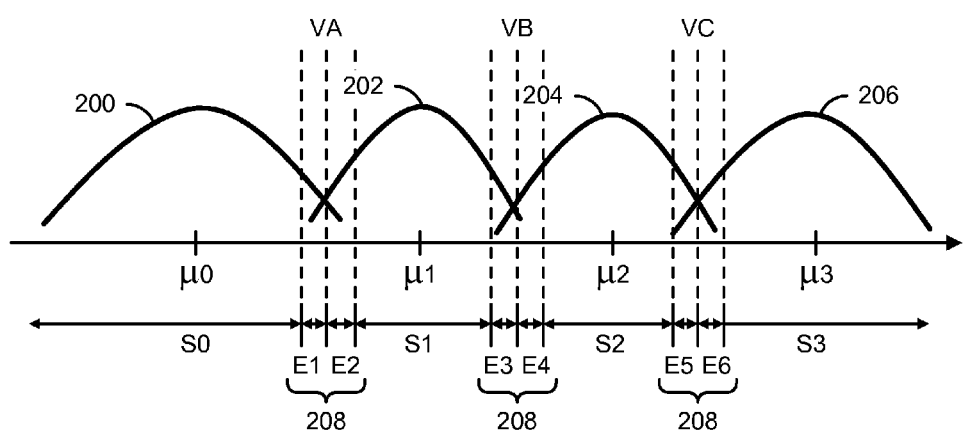
FIG. 6 is a diagram of retry read wordline voltages.

Referring to FIG. 6, a diagram of example retry read wordline voltages is shown. The read voltages VA, VB and VC are usually adjusted to minimize a bit error rates of two pages separately. Each read voltage VA, VB and VC can be changed to create multiple decisions (e.g., E0-E6) between adjoining decisions S0 to S3. A range in which the read voltages VA, VB, VC can be adjusted is referred to as a voltage sweep window 208.

Figure 7:
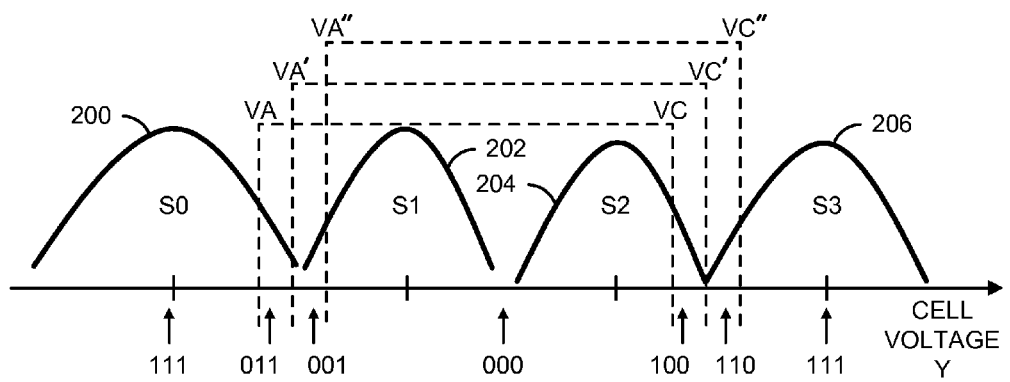
FIG. 7 is a diagram of valid wordline voltage settings.

Referring to FIG. 7, a diagram of example valid wordline voltage settings is shown. Generally, more thresholds (e.g., VA, VA', VA", VC, VC' and VC") result in higher quality of the converted soft decisions. The procedure of applying thresholds affect valid hard decision patterns. For example, all valid hard decisions illustrated in FIG. 7 are {111, 011, 001, 000, 100, 110}. A strategy of setting the thresholds effects the quality of both hard decisions and soft decisions. A robust strategy aimed at reducing fringe effects of limited voltage sweep windows and have manageable throughput and bit error rate cost is provided in the invention.

Figure 8:
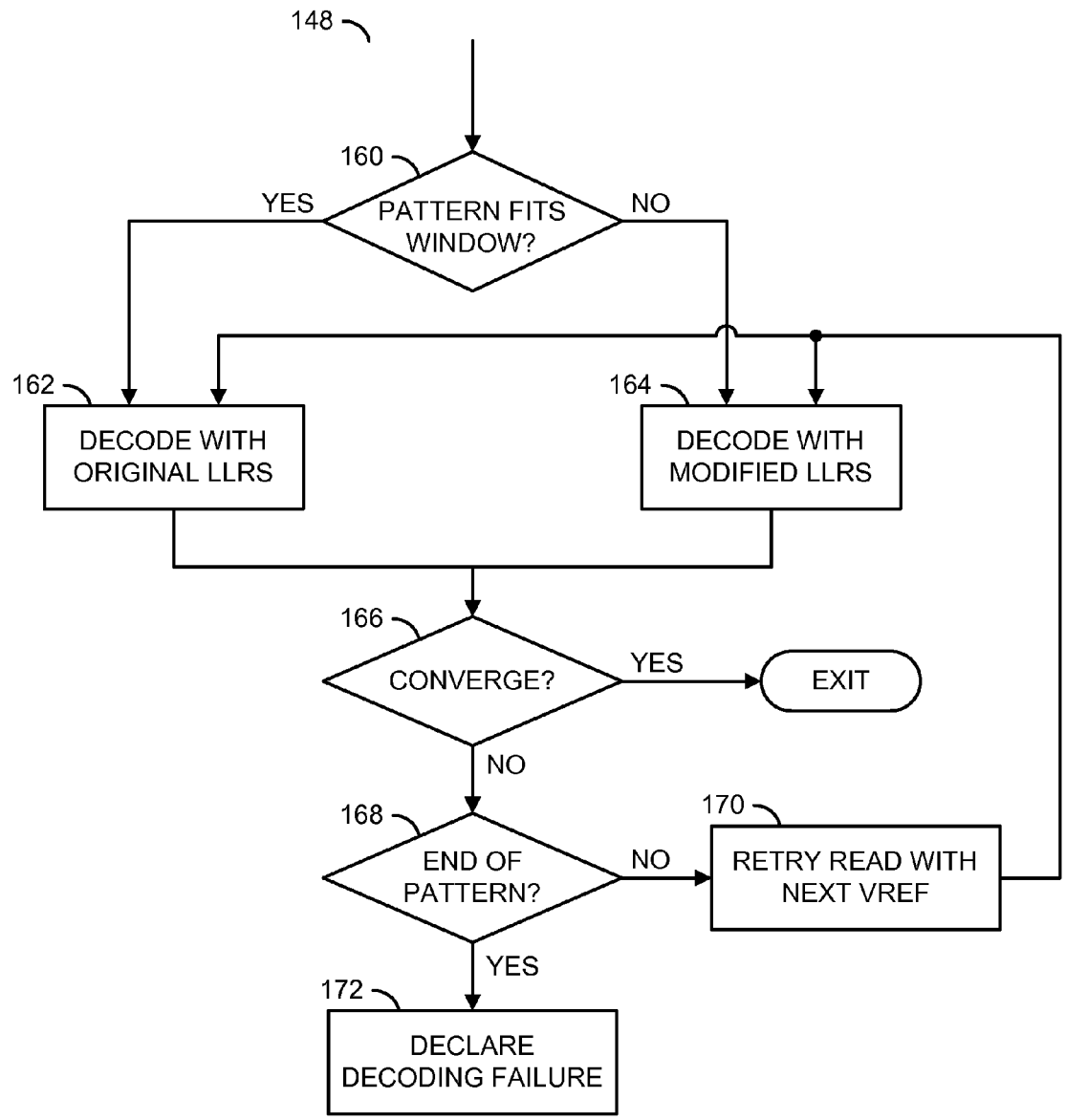
FIG. 8 is a flow diagram of a soft decision decode step.

Referring to FIG. 8, a flow diagram of an example implementation of the soft decision decode step 148 is shown. The step 148 is implemented by the circuit 100. The step 148 generally comprises a step (or state) 160, a step (or state) 162, a step (or state) 164, a step (or state) 166, a step (or state) 168, a step (or state) 170 and a step (or state) 172. The steps 160 to 172 may represent modules and/or blocks that may be implemented as hardware, software, a combination of hardware and software, or other implementations. The sequence of the steps is shown as a representative example. Other step orders may be implemented to meet the criteria of a particular application.

In the step 160, the circuit 120 determines if a pattern of multiple (e.g., seven) read reference voltages would fit into the voltage sweep window should the pattern be started at the preferred (or calculated) read voltage. If the pattern fits, the circuit 120 reads a codeword at an initial read voltage and the circuit 118 decodes the codeword using an original set of log likelihood ratio values. If the pattern does not fit the voltage sweep window, the circuit 120 shifts the pattern toward a center of the voltage sweep window until the pattern fits and the circuit 118 decodes the codeword using modified log likelihood ratio values in the step 164. If the decoding converges per the step 166, the step 148 is ended and the decoded data is presented to the circuit 92 in the signal HOSTIO.

In situations where the decoding does not converge, the circuit 120 will check in the step 168 to see if an end of the read retry pattern has been reached. If one or more additional read reference voltages of the pattern remain to by used, the next reference voltage is commanded by the circuit 120 in the step 170. The circuit 94 subsequently re-reads the codeword based on the next read reference voltage. The step 148 subsequently returns to the step 162 or 164 (as was determined by the step 160 in the initial step of 148) to decode the current codeword again using a next set of log likelihood ratio values. A loop around the step 160 to the step 170 and back again generally continues until either a convergence is reached in the step 166 or all of the read reference voltages have been tried per the step 168. If decoding has not been successful after a last retry read has been made and a last set of log likelihood ratio values has been used in the decoding, the circuit 100 declares a decoding failure in the step 172 and the step 148 ends.

In some embodiments, the modified log likelihood ratio (soft) values are calculated as part of a design process based on multiple rules. The rules generally include, but are not limited to, the following. Rule 1: When two reads enclose the preferred read location, but that preferred read has not yet been done, the modified log likelihood ratio values for the decision region should be 0. Rule 2: The first and last log likelihood ratio values should be the same to enable storage of only the lower page tables and, then, stitch the lower page tables together to generate upper page tables. Rule 3: The log likelihood ratio value signs at the right and left of the preferred read location have opposite signs. Rule 4: The log likelihood ratio values grow in magnitude as decisions regions are further away from the preferred read locations. Rule 5: The log likelihood ratio value magnitudes grow almost linearly in the number of delta shifts away from the preferred read locations. Rule 6: The first and last log likelihood ratio values are scaled down in magnitude from a maximum possible value in a fixed point representation to improve performance in a low density parity check decoding error floor. Rule 7: An exception to rule 6 happens if too many decision regions would have repeated log likelihood ratio values if scaling down, then, the largest possible log likelihood ratio value is used so as not to waste the available read retries. Rule 8: The first or last log likelihood ratio value is scaled down even further from that in rule 6 if the preferred read location is to the left of the leftmost read or to the right of the rightmost read at any read retry stage.

Referring to FIG. 9, a table of exemplary default log likelihood ratio values is shown. Table 1 generally illustrates a lookup table for a two-bit per cell type memory. Table 1 is stored in the circuit 116.

A center of the voltage sweep window being retried, and thus the initial retry read in FIG. 6, is chosen to reduce the corresponding lower page and upper page bit error rates. Lowering the bit error rates use side information, available in the form of the means $\mu$ and variances $\rho$ of the charge-state probability distributions 200-206. However, if such information about the statistics of a certain state is not readily available, the corresponding log-likelihood ratio values cannot be computed as the means and variances to plug into the likelihood computation formulas would not be available. In other scenarios, obtaining such information is costly, inaccurate, or is not supported by the flash architecture in an efficient manner.

In such situations, a default lookup-table (e.g., LUT) can be used to map decision regions (e.g., multi-read patterns) into predefined log likelihood ratio values. Application of the tables to the whole circuit 94 and can be programmed to be different for different flash types. In other embodiments, different tables can be maintained for different channel conditions. For example, different lookup tables are stored for different program/erase cycle (e.g., PEC) points or read disturb cycles. In addition, different log likelihood ratio value can be maintained in the circuit 116 for odd and even wordlines in even-odd architectures, or for single level cell (e.g., SLC) blocks, embedded single-level cell pages, or lower page only (e.g., LPO) pages.

Table 1 shows an exemplary default table that has the characteristics of being symmetric around the initial read, has no zero log likelihood ratio values, and the log likelihood ratio values are drawn from a fixed point Q4.0 signed representation. Although the largest entries in the signed representation can be negative (e.g., −8) or positive (e.g., +7), smaller maximum entries are chosen to reduce the occurrence of saturated log likelihood ratio values at error locations, which can be as issue in low density parity check soft decoding. The entries of the lookup table can be different for different flash makers, which is decided in the process of qualifying the flash with the controller using the scheme herein. Hence, the lookup table can look different, for example, by being non-symmetric and/or have zero entries for other flash types or persistent channel impairments.

Figure 10:
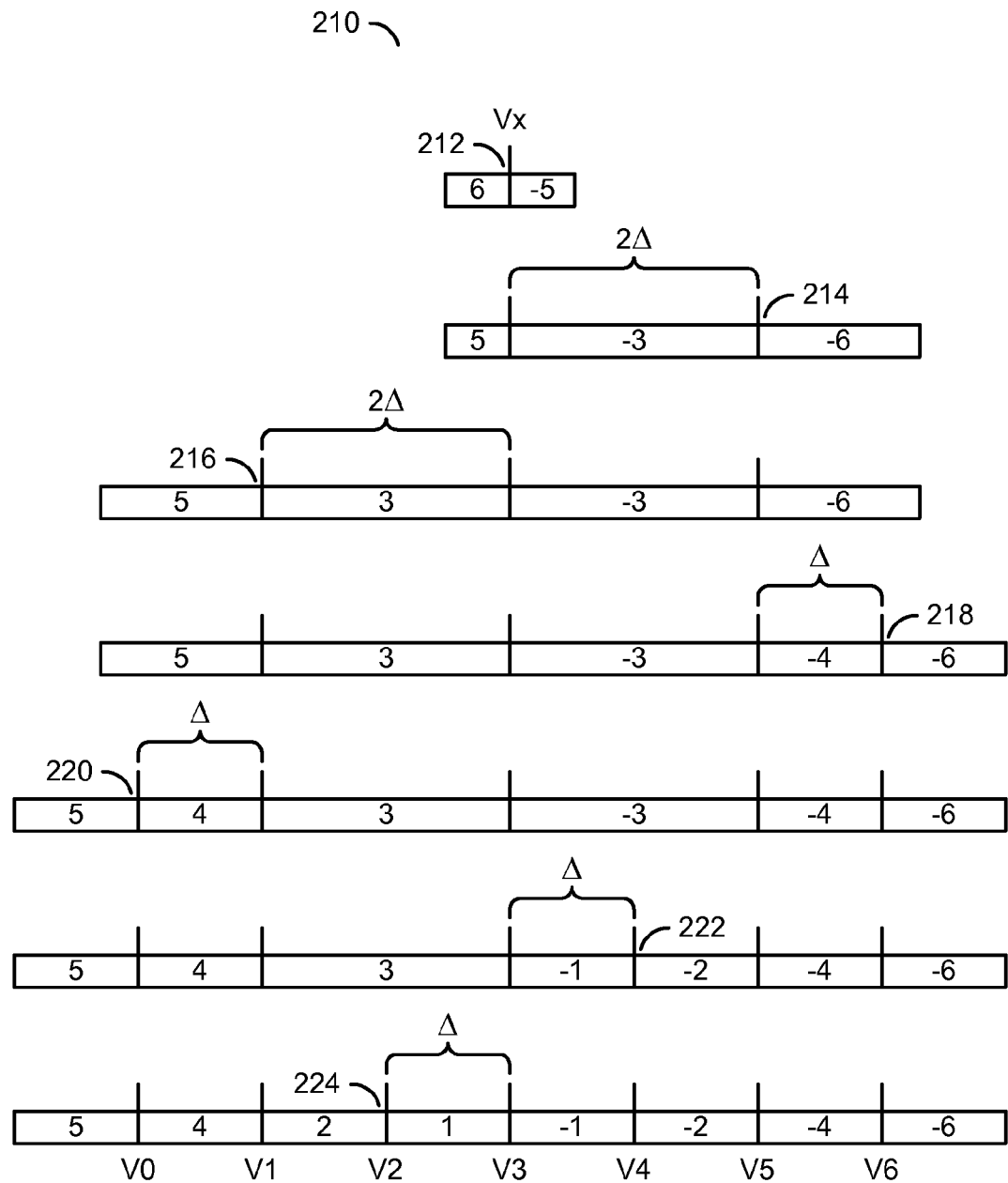
FIG. 10 is a diagram of a read retry sequence.

Referring to FIG. 10, a diagram of an example read retry sequence 210 is shown. The sequence 210 may be implemented by the circuit 120. The sequence 210 generally comprises an initial read reference voltage 212 and multiple read retry voltages 212-224. The read retry sequence 210 corresponds to the log likelihood ratio entries for read retries 1 to 7 in Table 1.

A delta voltage (e.g., Δ) is a smallest retry spacing in volts or manufacturer-specified codes. An initial read voltage (e.g., Vx) is the preferred (or calculated) read reference voltage. In various embodiments, the preferred read voltage Vx is supplied by a reference voltage tracking technique. In some embodiments, the reference voltage Vx is a default voltage that is chosen to match a specific worst case program/erase cycle or retention condition. Note that the voltage Δ is programmable with a certain default value for a specific flash maker. Furthermore, the default lookup table in Table 1 is tailored for the read sequence in FIG. 10, which if changed implies that values of the default table should be change accordingly.

In an offline determination of the voltage Δ for a specific flash type, several targets are to be achieved; such as to improve a probability of soft decoding convergence after a specified maximum number of read retries (e.g., seven reads), and to improve a probability of soft decoding convergence per read retry. Another target would be to reduce the occurrence of limited sweep issues, where the several read retries cannot be placed all within the sweep limits if centered around the preferred read reference voltage Vx. A larger fixed voltage Δ will increase a frequency of such corner cases. A smaller voltage Δ will result in an increase in the frequency of illegal read patterns (multi-read hard patterns to be converted to log likelihood ratios) due to the effect of read noise.

Multiple (e.g., two) parameters exist for setting the read reference voltage for a lower page. The values of the parameters can be found based on offline flash characterization results and/or online channel statistics. The voltage Δ parameter is a unit amount between two adjacent read voltages. A read order (e.g., RdOrd) parameter defines the order of applying read reference voltages (e.g., from low to high [V0, V1, V2, V3, V4, V5, V6]). For example, a parameter RdOrd=[V3, V5, V1, V2, V4, V0, V6] generally means using the read reference voltage V3 for an initial read, the read reference voltage V5 for the second read, the read reference voltage V1 for the third read, etc.

The parameter RdOrd is a programmable sequence. In various embodiments, a default order can be specified such as shown in FIG. 10 (e.g. [V3=212, V5=214, V1=216, V6=218, V0=220, V4=222, V2=224]). In some embodiments, the order would be decided dynamically by the circuit 100 (e.g., the circuit 120) on the-fly-based on channel statistics if enabled by hardware implementation. The initial hard read is the preferred voltage found by a tracking technique or is a predefined default.

Read voltage selection for upper pages is more complicated because of several issues. An issue is that for some flash devices, it is not allowed to set read voltages to negative values which would limit the sweep width naturally. Another issue is that the distribution of the erase states is not known or is difficult to estimate. Still another issue is that two reference voltages are applied for an upper page read that are hard to synchronize when a limited voltage sweep window is present. Three parameters are often used for setting the voltages of the upper page read. Parameter1: Delta1 is the space between two adjacent read reference voltages. The voltages are located between S0 and S1. Parameter2: Delta2 is the space between two adjacent voltages. The voltages are located between S2 and S3. Parameter 3: RdOrd is the parameter that defines the sequence of applying the multiple (e.g., seven) read voltage pairs. Generally, Delta1 and Delta2 may be the same and set to be the voltage Δ. Other values may be implemented to meet the criteria of a particular application.

Studying the retry specifications of different flash makers shows that the retry interfaces employ a limited sweep of the read reference voltage that does not enable coverage of all possible threshold voltages that the cell can assume. As a result, scenarios exist where the preferred read reference voltage Vx found by a good tracking technique can be very close to the edges of the voltage sweep window for such interfaces when having significant retention and/or endurance effects. Therefore, if for the simplicity of retry the spacing between retries is fixed to a uniform value of the voltage another issue is raised how to handle cases when the preferred read reference voltage is too close to the edge of the voltage sweep window. Being too close to the edge is also an issue if an arbitrarily small voltage Δ is not allowed by the flash memory interface and hence a fixed read sequence would not be possible.

A probability that the preferred read reference voltage Vx is too close to the voltage sweep window edges increases for narrow sweep voltage ranges. For the following examples, the sweep width is only several delta voltages (e.g., 10Δ) wide. In various embodiments, the circuit 100 is designed to account for situations where such uniform read retries in narrow voltage sweep windows have insufficient room at either side of the preferred read reference voltage Vx. The circuit 100 is also designed to obtain modified log likelihood ratio values where the preferred read reference voltage Vx is shifted to enable the pattern to fit entirely within the voltage sweep window.

In some embodiments, the circuit 100 implements a shifted retry read pattern where the distance between the preferred read reference voltage Vx and the voltage sweep window edges is less than a certain number of delta voltages that is a function of the maximum retries to be done (e.g., <3Δ for the 7-read retry scheme with uniform spacing). The shifted retry read pattern moves the center of the retry pattern toward a center of the voltage sweep window such that the initial read reference voltage (e.g., Vx) is at least the certain number of deltas from the sweep edges. Therefore, the preferred read reference voltage Vx found by the tracking is still among the retries, but not at the center (e.g., not the initial read reference voltage applied in the retry sequence). Still, the retry sequence shown in FIG. 10 will not change even if the preferred read reference voltage Vx is closer than 3Δ to the sweep edge. An advantage of such a scheme is that the retry sequence is the same for regular retry and retries with sweep edge proximity issues. Furthermore, the log likelihood ratio values computed based on the means and variances supplied by channel statistics tracking are unchanged and stored in the lookup table in the circuit 116.

In some embodiments, the default (or original) log likelihood ratio values in the lookup table can be kept the same as the normal (or non-shifted) scenario with modified (or compensated) log likelihood ratio values added to the lookup table to handle shifted preferred read reference voltages. In various embodiments, the modified log likelihood ratio values are stored in one or more edge lookup tables apart from the original log likelihood ratio values. Such lookup tables are shared between the lower pages and the upper pages, whenever the following scenarios occur:

Lower Page: R00 (VB) found by the tracking technique is less than 3Δ from sweep edge (e.g., Vedge from left or right).

Upper Page: Either preferred R01 (VA) or preferred R10 (VC) is found by tracking to be less than 3Δ from the sweep edge (e.g., Vedge from left or right).

A parameter (e.g., δ) is defined as a distance between the preferred read reference voltage Vx supplied by the tracking and the edge voltages Vedge. A retry read sequence is similar for all scenarios. In a first scenario, (i) the distance δ is more than or equal to 3Δ, the initial voltage applied is the preferred read reference voltage Vx and a center of the read retry voltage sweep window is also the preferred read reference voltage Vx.

Figure 11:
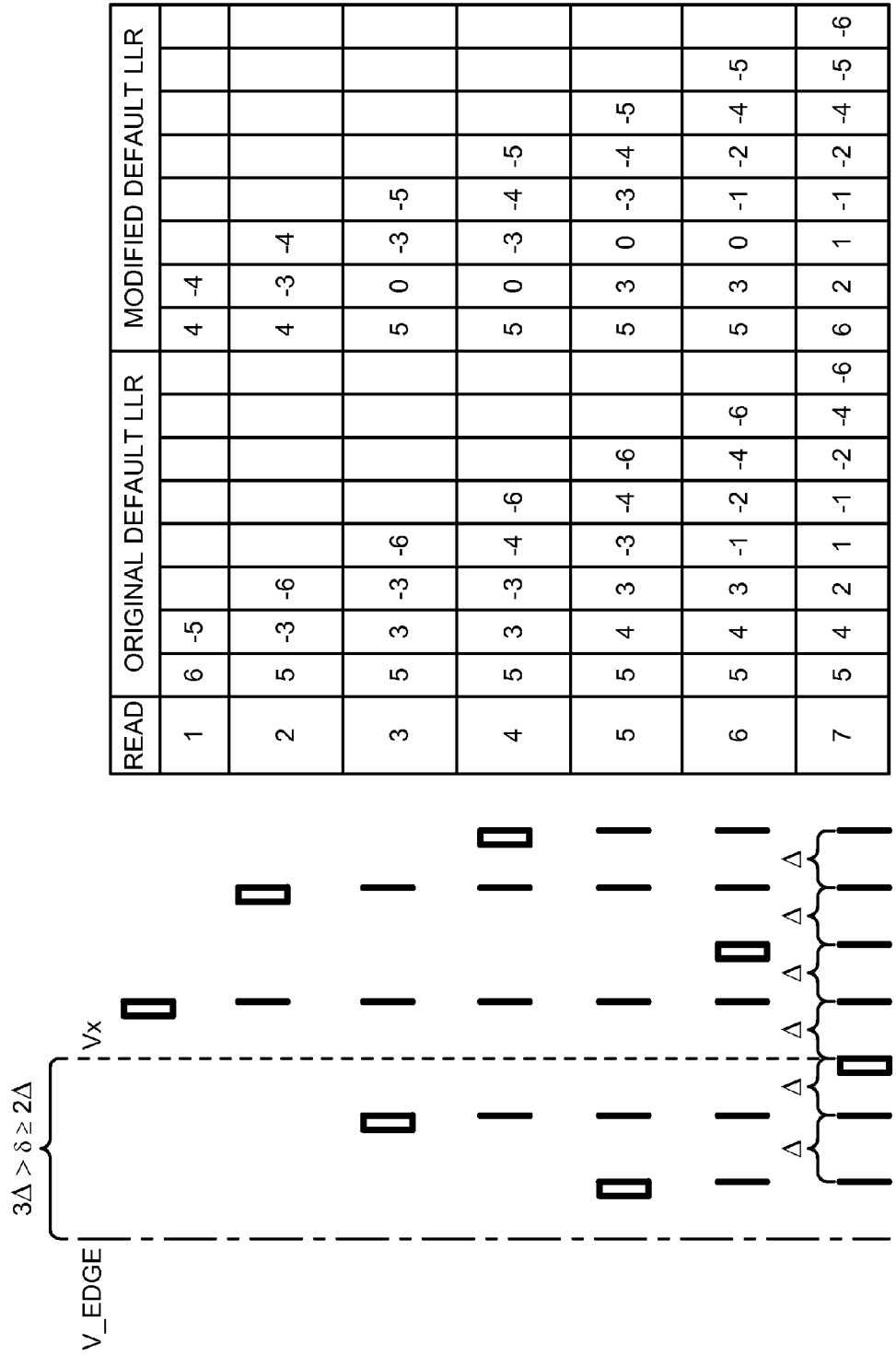
FIG. 11 is a diagram illustrating an initial voltage between two and three units from an edge.

Referring to FIG. 11, a diagram illustrating an initial voltage between two and three units from an edge is shown. In a second scenario (ii), the distance δ is more than or equal to 2Δ, but less than 3Δ, the initial voltage Vx applied is the preferred read reference voltage Vx plus the voltage Δ, and the preferred read reference voltage Vx is the last (e.g., 7th retry in the sequence.

Figure 12:
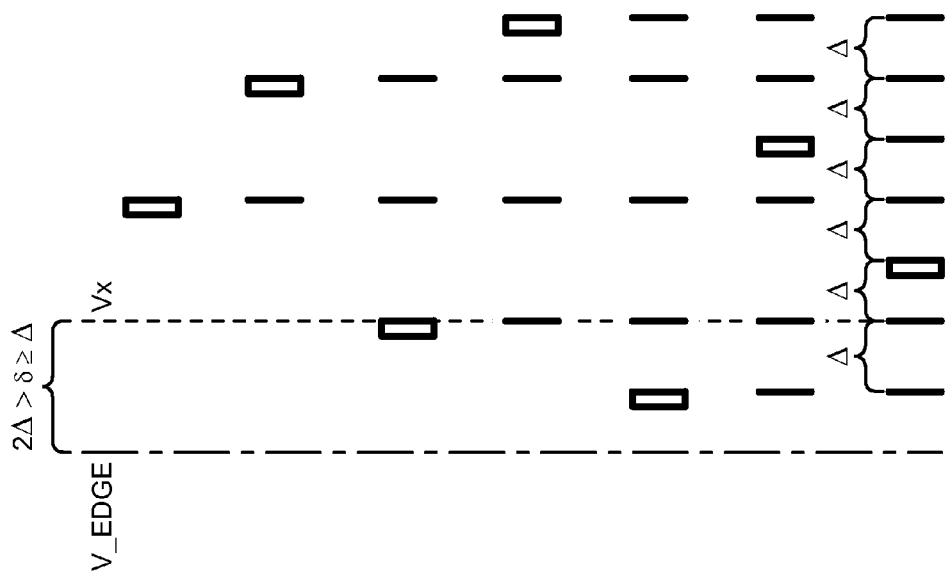
FIG. 12 is a diagram illustrating an initial voltage between one and two units from the edge.

Referring to FIG. 12, a diagram illustrating an initial voltage between one and two units from an edge is shown. In a third scenario (iii), the distance δ is more than or equal to Δ, but less than 2Δ, the initial voltage Vx applied is the preferred read reference voltage Vx plus the voltage 2Δ, and the preferred read reference voltage Vx is the 3rd retry in the retry sequence.

Figure 13:
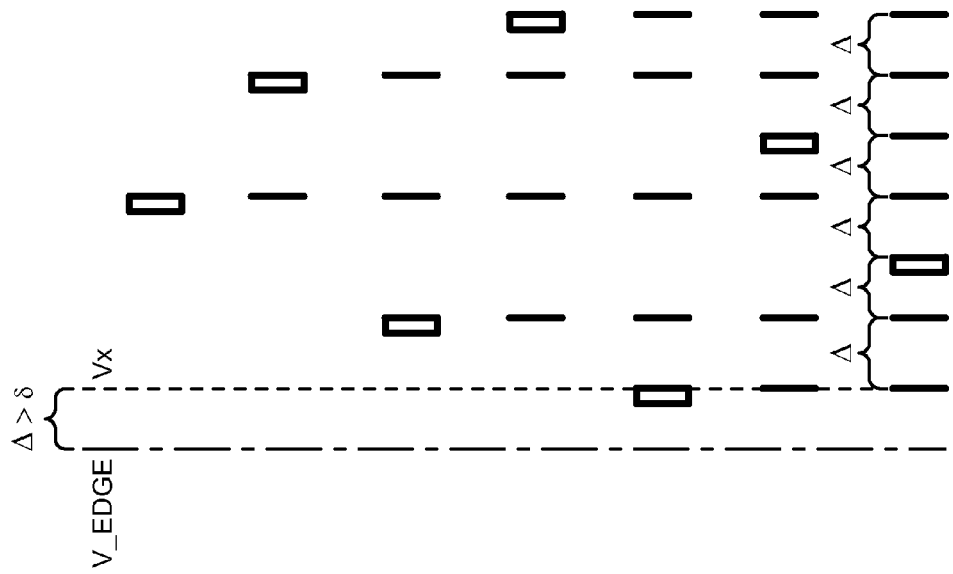
FIG. 13 is a diagram illustrating an initial voltage less than one unit from the edge.

Referring to FIG. 13, a diagram illustrating an initial voltage less than one unit from an edge is shown. In a fourth scenario (iv), the distance δ is more than or equal to 0, but less than Δ, the initial voltage Vx applied is the preferred read reference voltage Vx plus the voltage 3Δ, and the preferred read reference voltage Vx is the 5th retry in the retry sequence.

In the hard read in the normal mode of operation, the preferred read reference voltage Vx is used irrespective of the value of δ. In retry, even if the initial read is saved in the normal mode, still, the initial read is thrown away in scenarios (ii), (iii), and (iv) and the initial read is redone at the specified read reference to guarantee sufficient room to perform all of the retries in the pattern. If scenario (i) applies, the initial read from the normal mode may be retained to avoid redoing the initial read.

The center of the voltage sweep window being retried may not be the preferred read reference voltage Vx so the default (or original) read retry log likelihood ratio values in the lookup tables may no longer be suitable. In various embodiments, a log likelihood ratio value compensation generates a correct log likelihood ratio lookup table when a voltage shift happens to match the preferred read reference voltage Vx location. In other embodiments, the tables of the log likelihood ratio values for each retry is modified to use the knowledge of the location of the preferred read reference voltage Vx with respect to the retry window center. As a result, correct log likelihood ratio lookup tables for all retries can be created and thus avoid going to compensation as a last resort for all pages.

Figure 14:
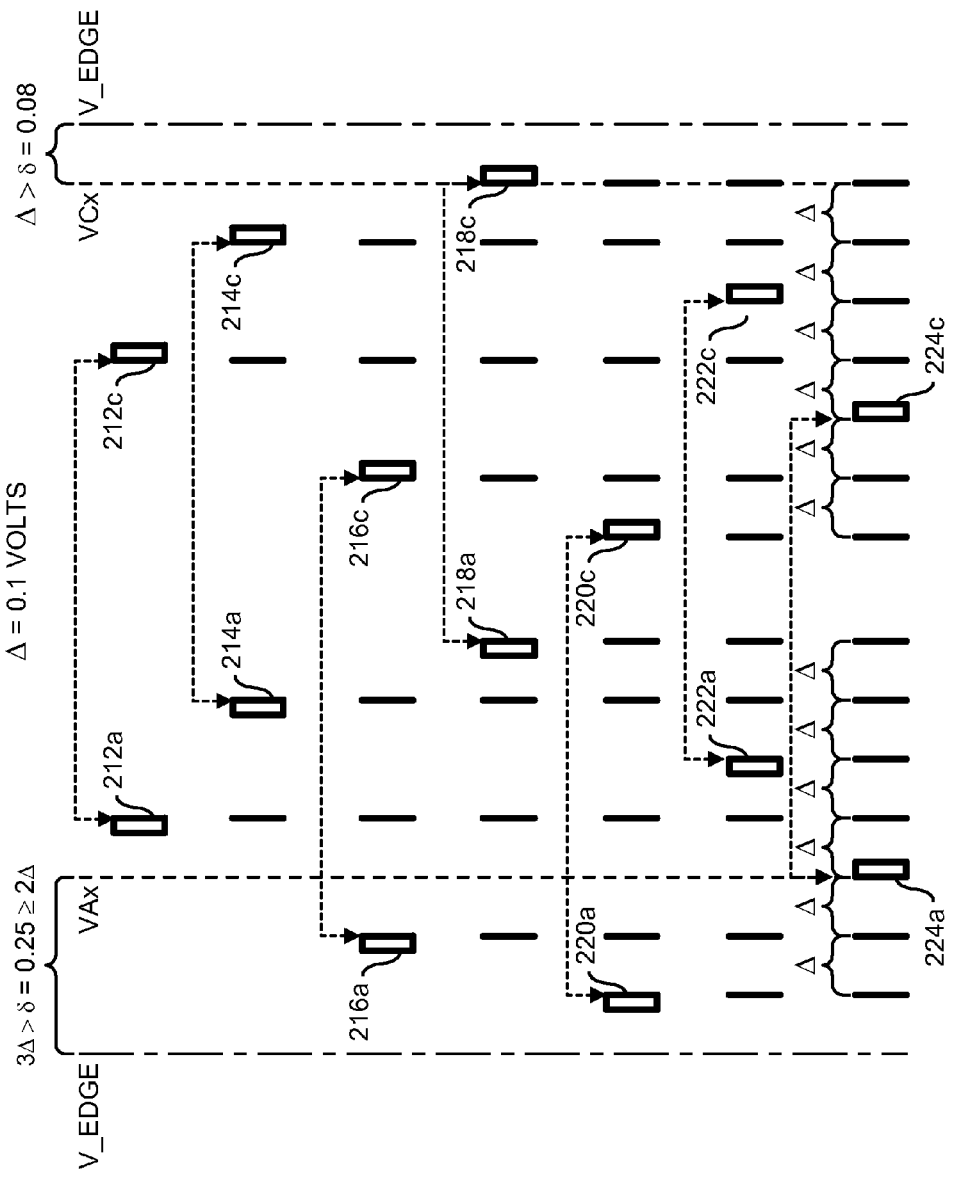
FIG. 14 is a diagram of retry spacing.

Referring to FIG. 14, a diagram of an example retry spacing is shown. Edge issues at both edges are illustrated in the example. The retry reads generally create an upper page edge table on-the-fly. The retry sequence is generally performed by the apparatus 100 (e.g., the circuit 120). In the example, the voltage $\Delta$ is set to 0.1 volts. The distance $\delta$ to the left (or lower) voltage sweep window edge is 0.25 volts. The distance $\delta$ to the right (or higher) voltage sweep window edge is 0.08 volts. A sequence of the VA reads are 212a, 214a, 216a, 218a, 220a, 222a and 224a. The preferred voltage VAx is at 224a. A sequence of the VC reads are 212c, 214c, 216c, 218c, 220c, 222c and 224c. The preferred voltage VCx is at 224c.

Referring to FIG. 15, an example set of lower page edge tables is shown. An upper page table is created by combining the two lower page edge tables (e.g., $\delta$=0.25 volts and $\delta$=0.08 volts).

Figure 16:
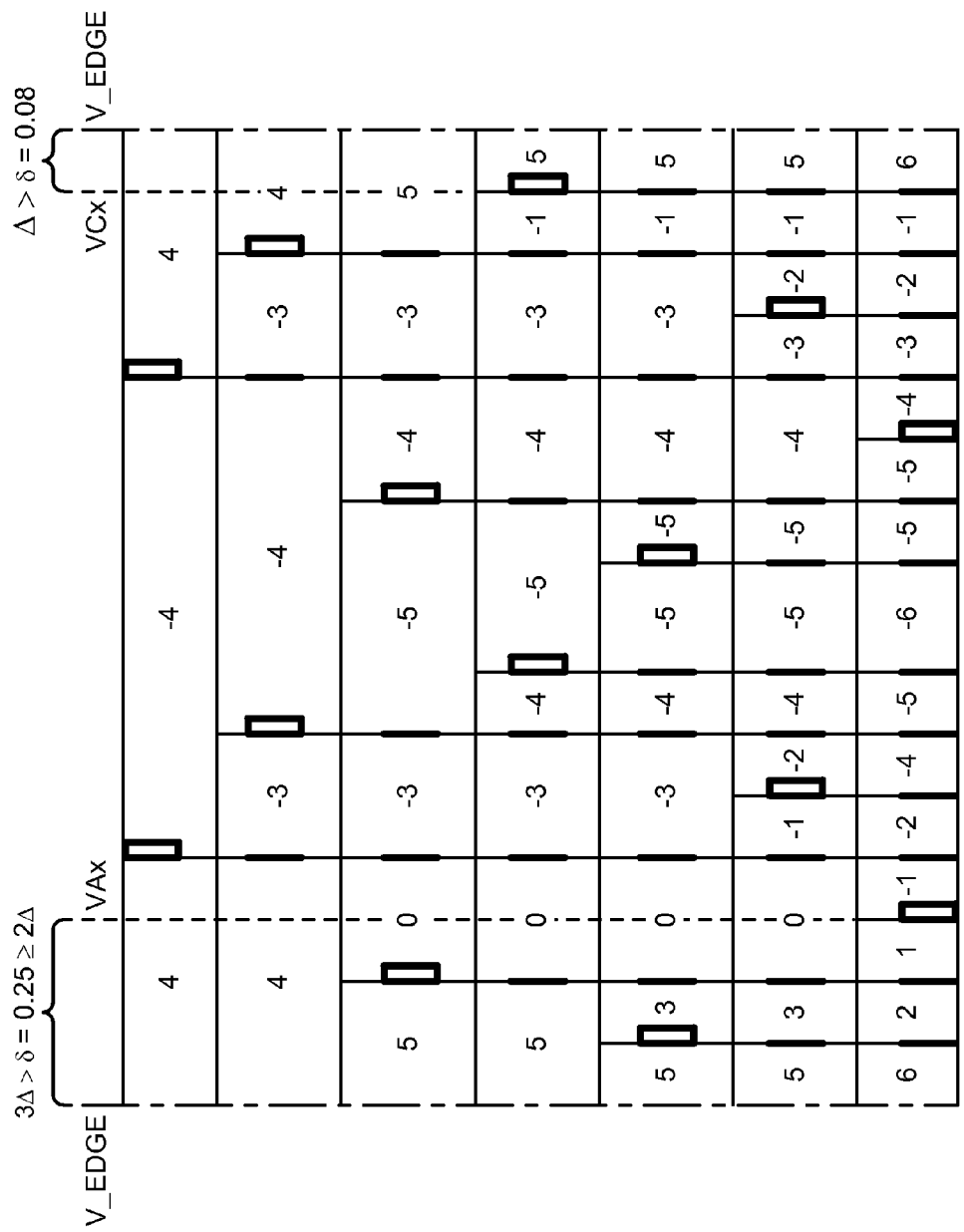
FIG. 16 is an upper page edge table.

Referring to FIG. 16, an example of an upper page edge table is shown. The table generally illustrates the final upper page table created by stitching together the two lower page edge tables from FIG. 14.

Figure 17:
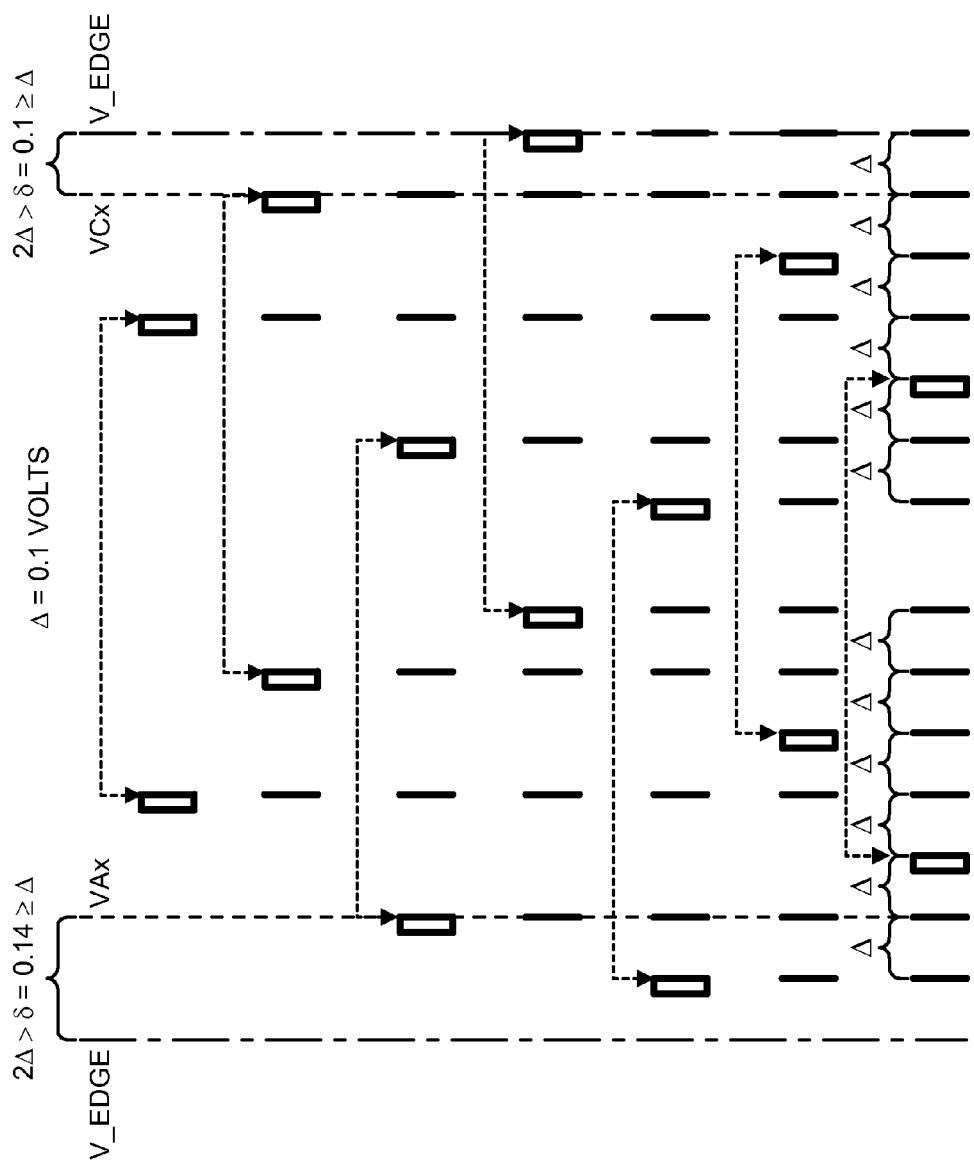
FIG. 17 is a diagram of another retry spacing.

Referring to FIG. 17, a diagram of another example retry spacing is shown. Additional edge issues at both edges are illustrated in the example. The retry reads generally create an upper page edge table on-the-fly. The retry sequence is generally performed by the apparatus 100 (e.g., the circuit 120). In the example, the voltage $\Delta$ is set to 0.1 volts. The distance $\delta$ to the left voltage sweep window edge is 0.14 volts. The distance $\delta$ to the right voltage sweep window edge is 0.1 volts.

Referring to FIG. 18, another example set of lower page edge tables is shown. An upper page table is created by combining the two lower page edge tables (e.g., $\delta$=0.14 volts and $\delta$=0.1 volts).

Figure 19:
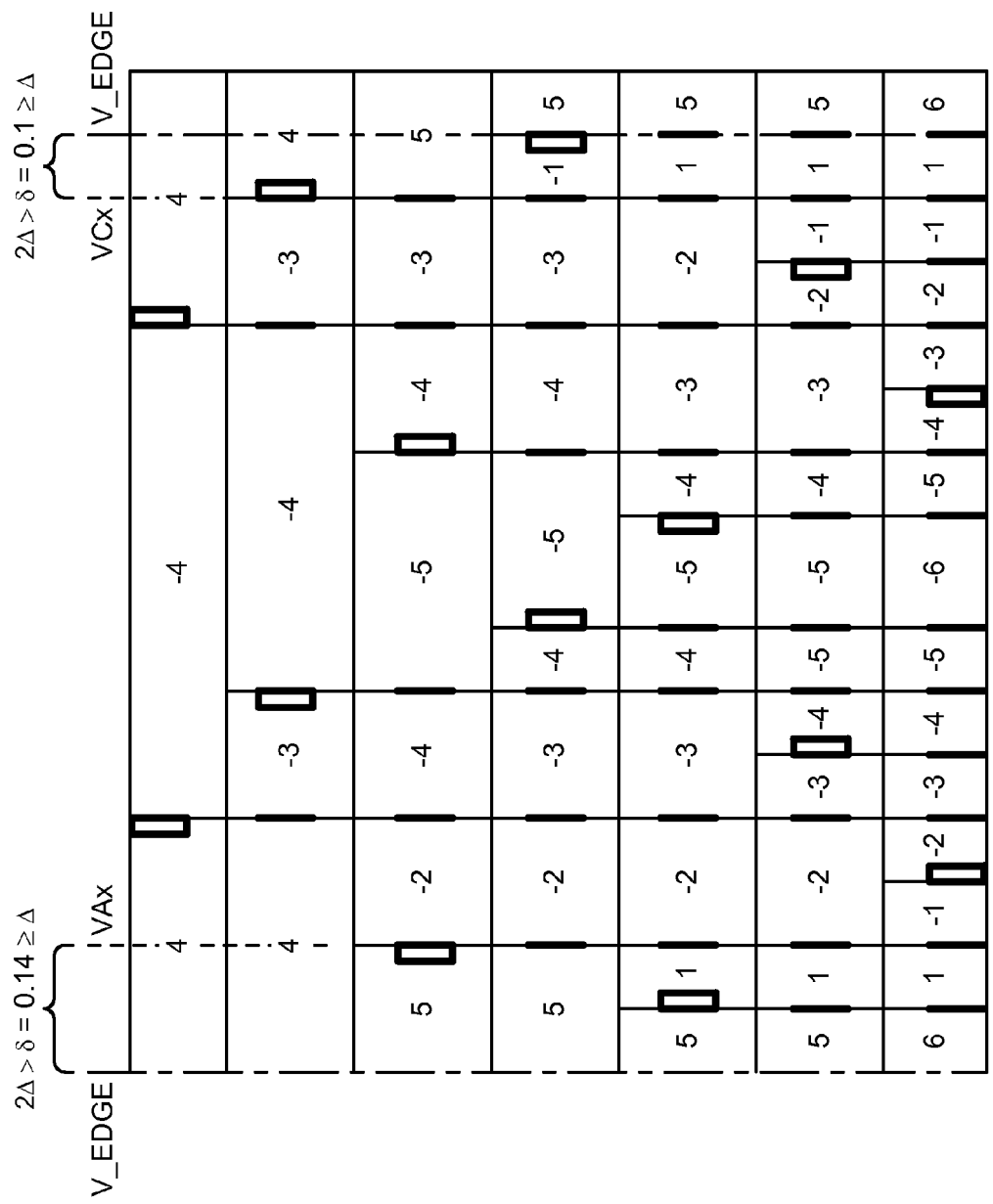
FIG. 19 is another upper page edge table.

Referring to FIG. 19, an example of another upper page edge table is shown. The table generally illustrates the final upper page table created by stitching together the two lower page edge tables from FIG. 18.

Figure 20:
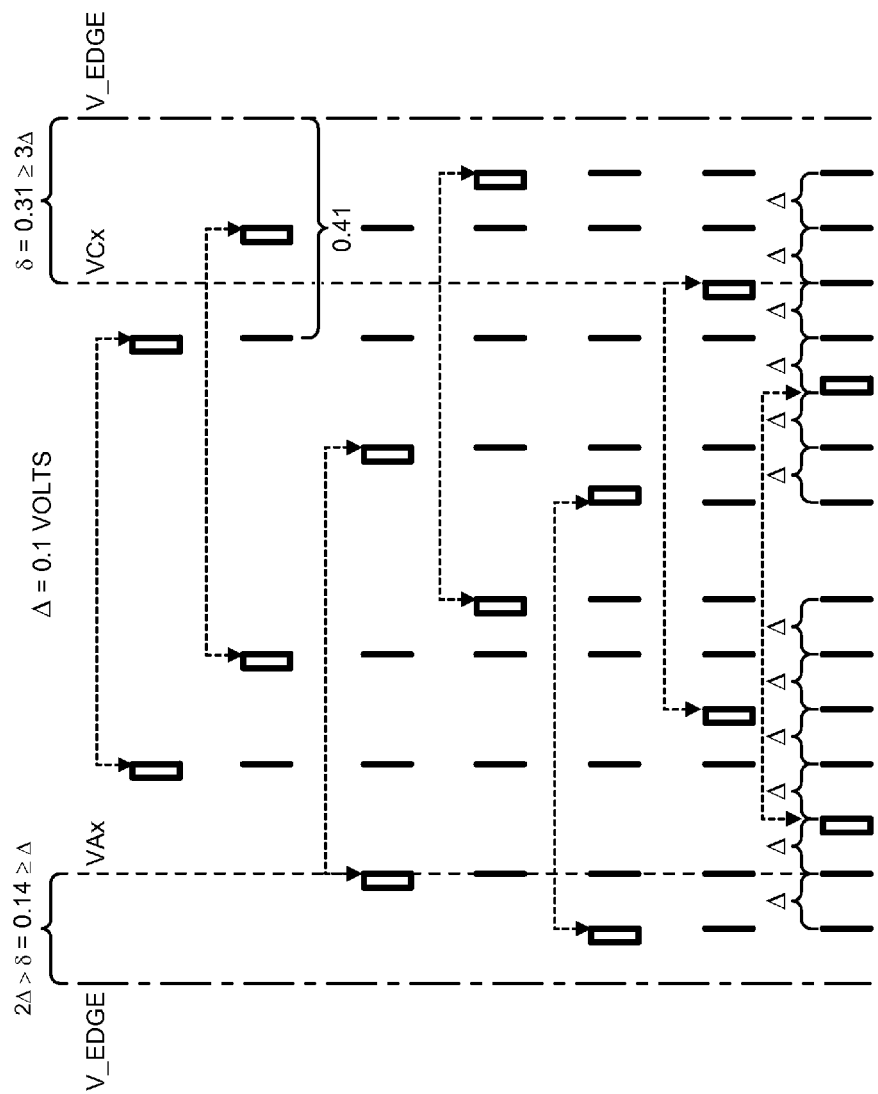
FIG. 20 is a diagram of a retry spacing.

Referring to FIG. 20, a diagram of another example retry spacing is shown. An edge issue exists for VAx but not VCx. The retry reads generally create an upper page edge table on-the-fly. The retry sequence is generally performed by the apparatus 100 (e.g., the circuit 120). In the example, the voltage $\Delta$ is set to 0.1 volts. The distance $\delta$ to the left voltage sweep window edge is 0.14 volts. The distance $\delta$ to the right voltage sweep window edge is 0.31 volts (e.g., 3$\Delta$ or more distance).

Referring to FIG. 21, another example set of lower page edge tables is shown. An upper page table is created by combining the two lower page edge tables (e.g., $\delta$=0.14 volts and $\delta$=0.31 volts).

Figure 22:
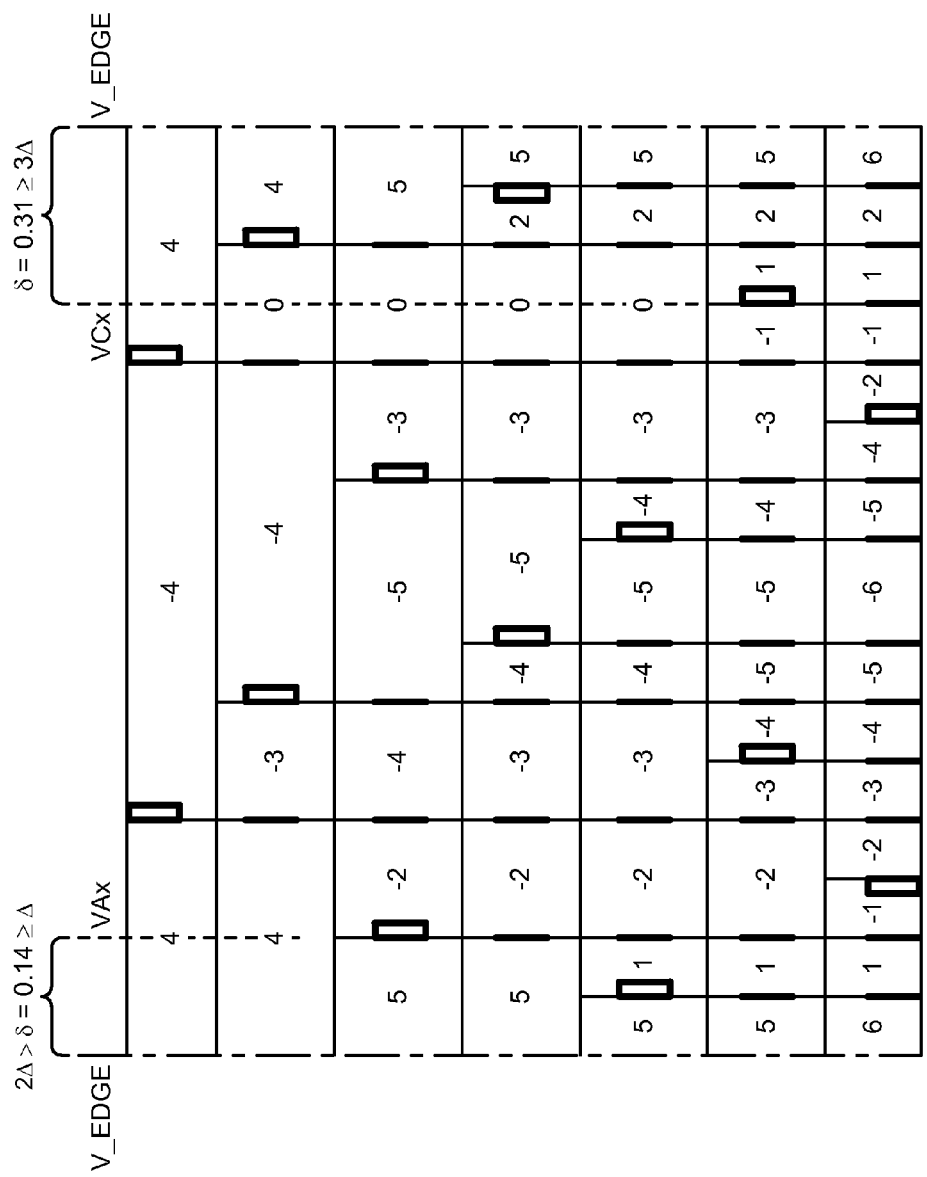
FIG. 22 is an upper page edge table.

Referring to FIG. 22, an example of another upper page edge table is shown. The table generally illustrates the final upper page table created by stitching together the two lower page edge tables from FIG. 20.

Figure 23:
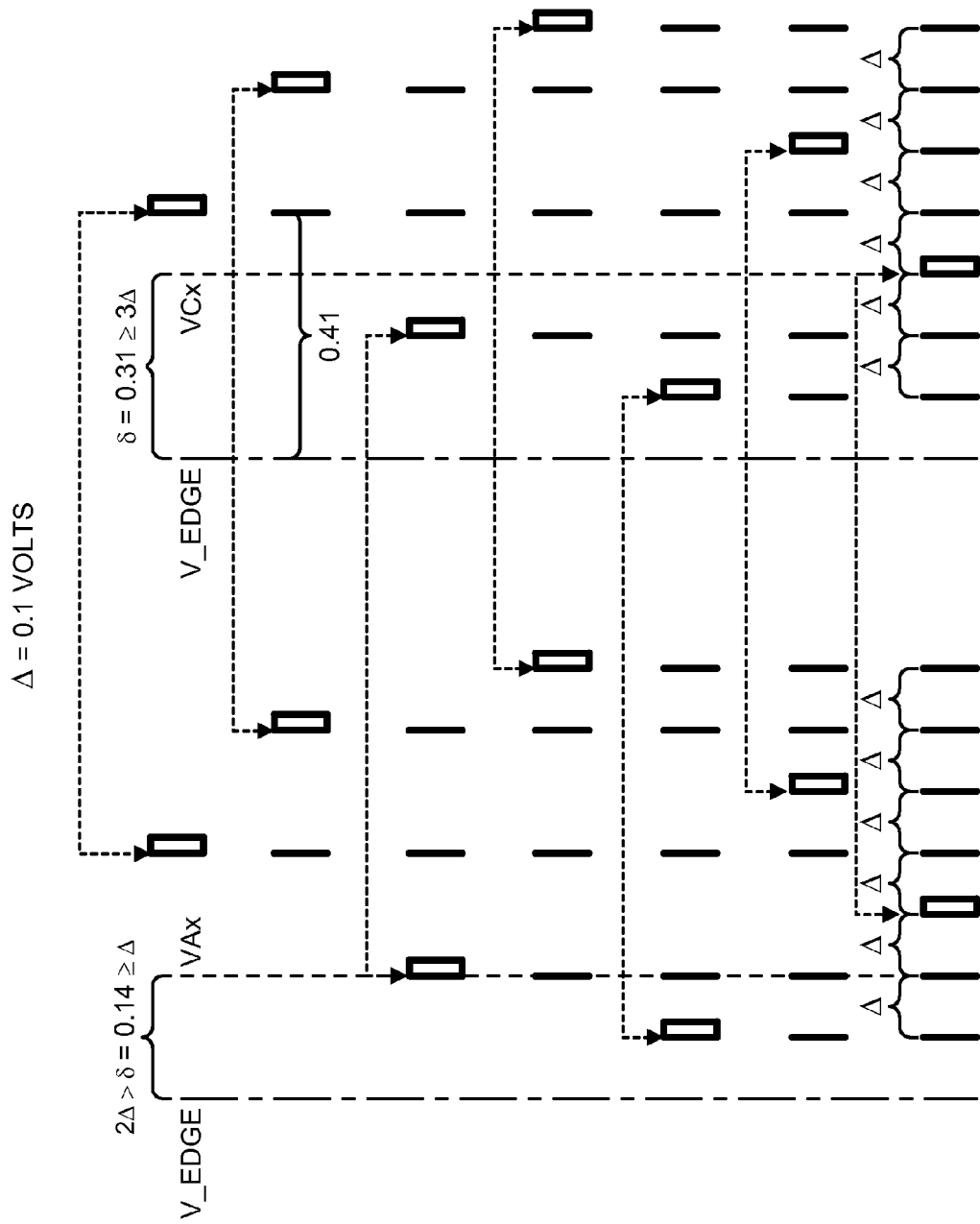
FIG. 23 is a diagram of another retry spacing.

Referring to FIG. 23, a diagram of another example retry spacing is shown. An edge issue exists for VAx with the left edge. The voltage VCx is illustrated beyond the right edge. The retry reads generally create an upper page edge table on-the-fly. The retry sequence is generally performed by the apparatus 100 (e.g., the circuit 120). In the example, the voltage $\Delta$ is set to 0.1 volts. The distance $\delta$ to the left voltage sweep window edge is 0.14 volts. The distance $\delta$ to the right voltage sweep window edge is 0.31 volts.

Referring to FIG. 24, another example set of lower page edge tables is shown. An upper page table is created by combining the two lower page edge tables (e.g., $\delta$=0.14 volts and $\delta$=0.31 volts).

Figure 25:
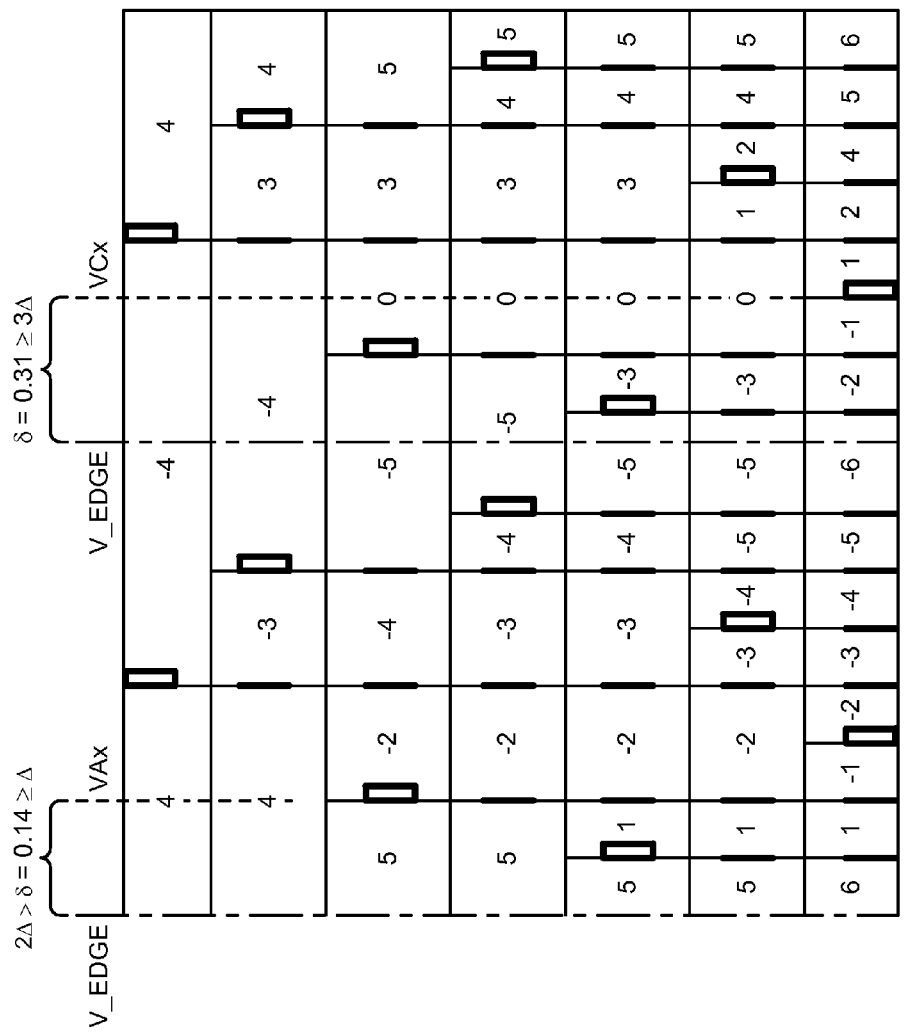
FIG. 25 is another upper page edge table.

Referring to FIG. 25, an example of another upper page edge table is shown. The table generally illustrates the final upper page table created by stitching together the two lower page edge tables from FIG. 20.

Creating of correct lookup tables generally involves several steps. An initial step is virtually separating a lower read reference voltage (e.g., VA) and an upper read reference voltage (e.g., VC) edge default tables for storage purposes. Between the two tables, the VA table (LLR0~LLR7) and VC table (LLR7~LLR13, LLR0) only share the LLR0 value and the LLR7 value. The two tables are stitched together into one table having the LLR0~LLR13 values, and are used to map the upper page hard read patterns to log likelihood ratio values. The lower page edge log likelihood ratio lookup table of a middle read reference voltage (e.g., VB) is used to generate the voltages VA and VC related to the edge lookup tables.

Several (e.g., 6) special mode default edge lookup tables for the voltage VB are used for the following cases. In an initial case, the sweep edge is on the right of voltage Vx, and 3$\Delta$>$\delta$≥2$\Delta$. In a next case, the sweep edge is on the left of voltage Vx, and 3$\Delta$>$\delta$≥2$\Delta$. Still another case, the sweep edge is on the right of voltage Vx, and 2$\Delta$>$\delta$≥$\Delta$. Another case has the sweep edge is on the left of voltage Vx, and 2$\Delta$>$\delta$≥$\Delta$. In some situations, the sweep edge is on the right of voltage Vx, and $\Delta$>$\delta$. In other situations, the sweep edge is on the left of voltage Vx, and $\Delta$>$\delta$.

The rules to stitch the voltage VA lookup table and the voltage VC lookup table to form an upper page lookup table include, but are not limited to, the following. Upper page tables are stitched to from the LLR0~LLR13 values, and used to map the upper page hard read patterns to the log likelihood ratio values. Shared log likelihood ratio value entries between the voltages VA and VC are the same for a certain number of retries to enable lookup table stitching. When a voltage VA (or VC) has a sweep edge issue and the other voltage VC (or VA) does not, and is closer to the right edge of the sweep (the higher voltage edge), the appropriate table for the voltage VA (or VC) is stitched with the table for the voltage VC (or VA) for any of the multiple (e.g., 6) sweep edge scenarios. As such, the default full table is created separately from the edge tables, see FIGS. 20, 21, and 22. When VA (VC) has a sweep edge issue and VC (VA) does not and is closer to the left edge of the sweep (the lower voltage edge), the appropriate table for VA (VC) is stitched with the table in FIG. 11 for VC (VA) for any of the multiple (e.g., 6) sweep edge scenarios. The stitching is done so that the default full table is adjusted separately from the edge tables, see FIGS. 23, 24, and 25. When VA (VC) has a sweep edge issue and VC (VA) does not and is similarly close to the left edge of the sweep and the right edge of the sweep, the appropriate table for VA (VC) is stitched with the lookup table for VC (VA) for any of the multiple (e.g., 6) sweep edge scenarios.

The functions performed by the diagrams of FIGS. 1-25 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instruction.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
an interface configured to process a plurality of read/write operations to/from a memory; and
a control circuit configured to (i) adjust an initial one of a plurality of read voltages in a read channel of the memory by shifting the initial read voltage an amount toward a center of a window, (ii) read a codeword from the memory a number of times and (iii) generate read data by an iterative decode of the codeword based on the reads, wherein (a) the window bounds a range of the read voltages, (b) each of the reads uses a different one of the read voltages according to a pattern, (c) the pattern is symmetrically spaced about the initial read voltage as shifted such that the read voltages of consecutive reads are on opposite sides of the initial read voltage and (d) the pattern fits in the window.

2. The apparatus according to claim 1, wherein (i) the control circuit is further configured to use a plurality of soft log likelihood ratio values in the iterative decode and (ii) the soft log likelihood ratio values are based on the number of times that the codeword is read.

3. The apparatus according to claim 2, wherein (i) a plurality of original log likelihood ratio values and a plurality of modified log likelihood ratio values are stored concurrently in one or more lookup tables, (ii) the original log likelihood ratio values are used as the soft log likelihood ratio values when the initial read voltage is unshifted in the window and (iii) the modified log likelihood ratio values are use as the soft log likelihood ratio values when the initial read voltage is shifted toward the center of the window.

4. The apparatus according to claim 2, further comprising one or more lookup tables configured to store a plurality of original log likelihood ratio values, wherein the soft log likelihood ratio values are generated in the control circuit by adjusting the original log likelihood ratio values based on the amount that the initial read voltage is shifted.

5. The apparatus according to claim 1, wherein the read voltages in the pattern are evenly spaced from each other by a uniform voltage value.

6. The apparatus according to claim 5, wherein the initial read voltage is shifted when the initial read voltage prior to the shift is less than a predetermined multiple of the uniform voltage value from an edge of the window.

7. The apparatus according to claim 1, wherein the memory is a nonvolatile memory.

8. The apparatus according to claim 1, wherein the apparatus is implemented as one or more integrated circuits.

9. A method for multiple read retries in a read channel, comprising the steps of:
adjusting an initial one of a plurality of read voltages in the read channel of a memory by shifting the initial read voltage an amount toward a center of a window, wherein the window bounds a range of the read voltages;
reading a codeword from the memory a number of times, wherein (i) each of the reads uses a different one of the read voltages according to a pattern, (ii) the pattern is symmetrically spaced about the initial read voltage as shifted such that the read voltages of consecutive reads are on opposite sides of the initial reference voltage and (iii) the pattern fits in the window; and
generating read data by an iterative decode of the codeword based on the reads.

10. The method according to claim 9, further comprising the step of:
using a plurality of soft log likelihood ratio values in the iterative decode, wherein the soft log likelihood ratio values are based on the number of times that the codeword is read.

11. The method according to claim 10, wherein (i) a plurality of original log likelihood ratio values and a plurality of modified log likelihood ratio values are stored concurrently in one or more lookup tables, (ii) the original log likelihood ratio values are used as the soft log likelihood ratio values when the initial read voltage is unshifted in the window and (iii) the modified log likelihood ratio values are use as the soft log likelihood ratio values when the initial read voltage is shifted toward the center of the window.

12. The method according to claim 10, further comprising the step of:
generating the soft log likelihood ratio values by adjusting a plurality of original log likelihood ratio values based on the amount that the initial read voltage is shifted, wherein the original log likelihood ratio values are stored in one or more lookup tables.

13. The method according to claim 9, wherein the read voltages in the pattern are evenly spaced from each other by a uniform voltage value.

14. The method according to claim 13, wherein the initial reference voltage is shifted when the initial read voltage prior to the shift is less than a predetermined multiple of the uniform voltage value from an edge of the window.

15. The method according to claim 9, wherein the memory is a nonvolatile memory.

16. The method according to claim 10, further comprising the steps of:
storing a plurality of original log likelihood ratio values in one or more lookup tables; and
generating the soft log likelihood ratio values by adjusting the original log likelihood ratio values based on the amount that the initial read voltage is shifted.

17. The method according to claim 9, wherein the method is implemented in a memory controller.

18. The apparatus according to claim 1, wherein the interface and the control circuit are part of a memory controller.

19. An apparatus comprising:
a nonvolatile memory configured to process a plurality of read/write operations; and
a controller configured to (i) adjust an initial one of a plurality of read voltages in a read channel of the nonvolatile memory by shifting the initial read voltage an amount toward a center of a window, (ii) read a codeword from the memory a number of times and (iii) generate read data by an iterative decode of the codeword based on the reads, wherein (a) the window bounds a range of the read voltages, (b) each of the reads uses a different one of the read voltages according to a pattern, (c) the pattern is symmetrically spaced about the initial read voltage as shifted such that the read voltages of consecutive reads are on opposite sides of the initial read voltage and (d) the pattern fits in the window.

20. The apparatus according to claim 19, wherein the nonvolatile memory and the controller are part of a solid-state drive.

* * * * *